United States Patent
Chaki et al.

(10) Patent No.: US 12,279,153 B2
(45) Date of Patent: Apr. 15, 2025

(54) SHORT MESSAGE SERVICE CONGESTION MANAGER

(71) Applicant: AT&T Intellectual Property I, L.P., Atlanta, GA (US)

(72) Inventors: Tarun Chaki, Morganville, NJ (US); Thusitha Jayawardena, Holmdel, NJ (US); Jitendra Patel, Dardenne Prairie, MO (US); Nicholas Thompson, Lake In The Hills, IL (US); Nicholas Arconati, St. Louis, MO (US)

(73) Assignee: AT&T Intellectual Property I, L.P., Atlanta, GA (US)

( * ) Notice: Subject to any disclaimer, the term of this patent is extended or adjusted under 35 U.S.C. 154(b) by 416 days.

(21) Appl. No.: 17/453,083

(22) Filed: Nov. 1, 2021

(65) Prior Publication Data
US 2023/0137949 A1 May 4, 2023

(51) Int. Cl.
G06F 15/16 (2006.01)
G06N 20/00 (2019.01)
H04W 4/14 (2009.01)
H04W 24/08 (2009.01)
H04W 28/02 (2009.01)

(52) U.S. Cl.
CPC ........ *H04W 28/0289* (2013.01); *G06N 20/00* (2019.01); *H04W 4/14* (2013.01); *H04W 24/08* (2013.01)

(58) Field of Classification Search
None
See application file for complete search history.

(56) References Cited

U.S. PATENT DOCUMENTS

| 7,869,794 B1 * | 1/2011 | Weaver | H04W 4/14 455/412.2 |
| 10,158,974 B1 * | 12/2018 | Merjanian | H04W 4/06 |
| 11,804,050 B1 * | 10/2023 | Milletari | G06N 3/063 |

(Continued)

OTHER PUBLICATIONS

"5G Implementation Guidelines: SA Option 2," GSM Association, Jun. 2020, 44 pages.

(Continued)

*Primary Examiner* — Phuoc H Nguyen
(74) *Attorney, Agent, or Firm* — Guntin & Gust, PLC; Atanu Das

(57) ABSTRACT

The described technology is generally directed towards a short message service (SMS) congestion manager that can evaluate, predict, and mitigate SMS congestion. The SMS congestion manager can be implemented within a short message services function (SMSF) of a fifth generation (5G) or subsequent generation cellular network. The SMS congestion manager can monitor a volume of non-access stratum (NAS) SMS messages in order to detect potential overload conditions wherein the volume of messages exceeds a capability of a network function. In response to detecting potential overload conditions, the SMS congestion manager can inhibit messages directed to the network function in order to prevent overloads from developing. The SMS congestion manager can use machine learning to learn to detect the potential overload conditions as well as to learn actions to take to address the potential overload conditions.

20 Claims, 10 Drawing Sheets

(56) References Cited

U.S. PATENT DOCUMENTS

| | | | | |
|---|---|---|---|---|
| 2002/0082023 | A1* | 6/2002 | Bark | H04W 52/343 |
| | | | | 455/450 |
| 2006/0173985 | A1* | 8/2006 | Moore | H04L 67/00 |
| | | | | 707/E17.116 |
| 2011/0267948 | A1* | 11/2011 | Koc | H04W 72/21 |
| | | | | 370/235 |
| 2014/0128047 | A1* | 5/2014 | Edwards | H04L 51/212 |
| | | | | 455/415 |
| 2015/0223146 | A1* | 8/2015 | Pinheiro | H04W 48/02 |
| | | | | 370/230 |
| 2015/0256961 | A1* | 9/2015 | Kim | H04W 4/70 |
| | | | | 370/329 |
| 2017/0006442 | A1* | 1/2017 | Lee | H04W 48/12 |
| 2017/0150332 | A1* | 5/2017 | Palanisamy | H04W 4/70 |
| 2019/0141197 | A1* | 5/2019 | Feldman | H04M 17/10 |
| 2021/0084670 | A1* | 3/2021 | Chauhan | H04L 65/80 |

OTHER PUBLICATIONS

"System architecture for the 5G System (5GS)," Specification # 23.501—3GPP, https://portal.3gpp.org/desktopmodules/Specifications/SpecificationDetails.aspx?specificationId=3144, 2016-2017, 1 page.
"SMS Evolution" GSM Association, Version 1.0, Feb. 4, 2019, 52 pages.

* cited by examiner

SHORT MESSAGE SERVICE CONGESTION MANAGER

TECHNICAL FIELD

The subject application is related to managing cellular network traffic congestion, and more particularly, to managing short message service traffic congestion in communication networks, e.g., fifth generation (5G) and subsequent generation cellular networks.

BACKGROUND

Massive machine type communication is a driver of 5G cellular network deployment. Internet of Things (IoT) communication falls into this category and is expected to grow ten-fold in density compared to fourth generation (4G) networks, resulting in up to a million or more devices per square kilometer.

Furthermore, many IoT devices are expected to be basic devices with minimal functionality to be used for periodic, low-bandwidth communication with application servers. Sensors in smart cities, automated manufacturing plants and autonomous vehicles are examples of such devices. These devices do not need voice communication and often rely on the short message service (SMS) for communicating with applications and servers.

Currently, there are two different mechanisms used for SMS type communications: (i) SMS over the control radio plane of 4G and 5G, using the non-access stratum (NAS) and (ii) SMS via the Internet Protocol (IP) Multimedia Subsystem (IMS), which supports IP based telephony using the session initiation protocol (SIP). When a device does not need voice communication, a natural choice for implementing SMS capability at lower cost is SMS over NAS.

SMS over NAS uses the control plane of the cellular radio network for SMS transport. Since the control plane is also used for critical functions of the network, it can become a point of failure, e.g., denial of service, when a large number of IoT devices send SMS messages simultaneously or within a short time interval, causing congestion in the physical radio channel for NAS.

Such a failure can be caused by a malicious attacker or by an unusual event which triggers large amounts of sensor data delivery via SMS within a short time window. The potential for this kind of congestion becomes increasingly possible as the IoT device density grows in 5G networks. Thus, the need to mitigate congestion caused by densely deployed SMS-enabled devices will be important in 5G networks.

The above-described background is merely intended to provide a contextual overview of some current issues, and is not intended to be exhaustive. Other contextual information may become further apparent upon review of the following detailed description.

BRIEF DESCRIPTION OF THE DRAWINGS

Non-limiting and non-exhaustive embodiments of the subject disclosure are described with reference to the following figures, wherein like reference numerals refer to like parts throughout the various views unless otherwise specified.

DETAILED DESCRIPTION

Figure 1:
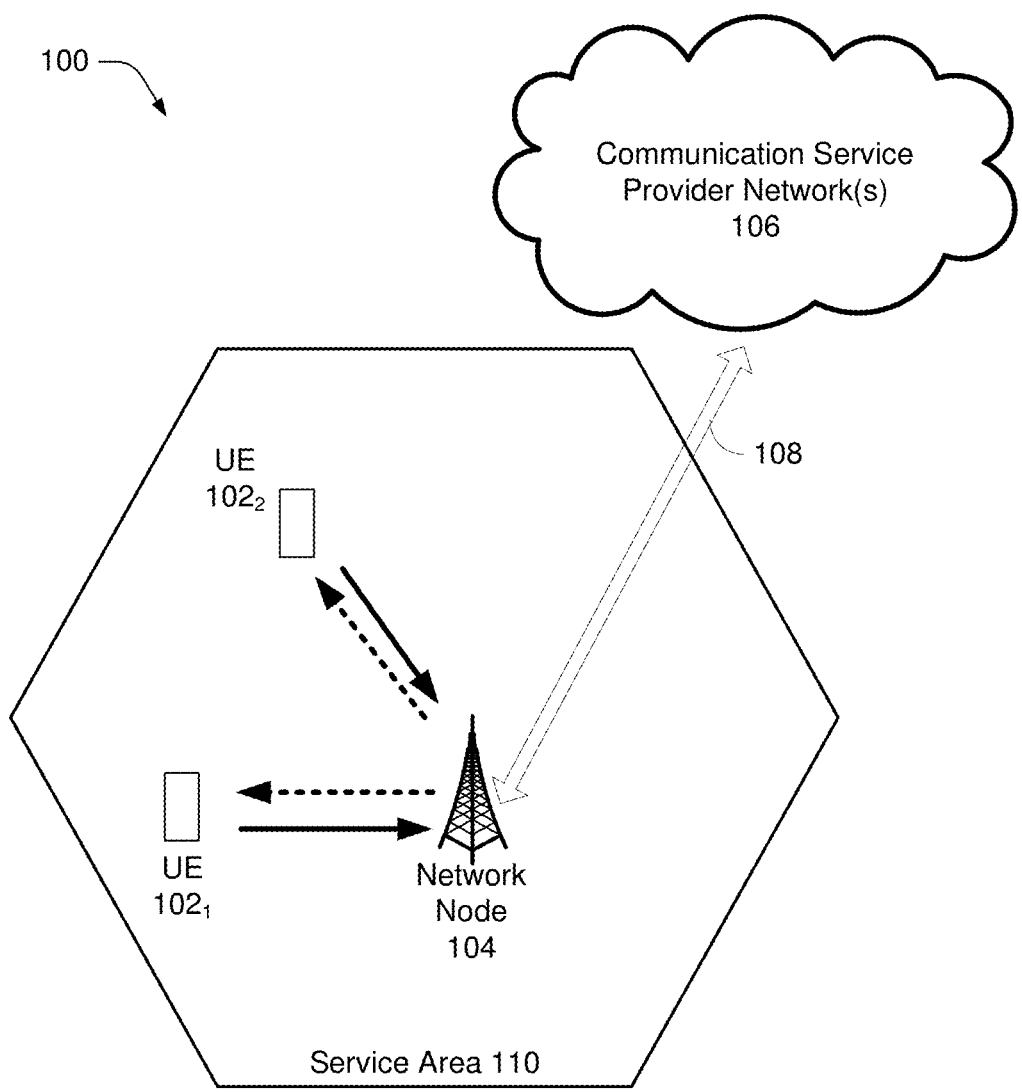
FIG. 1 illustrates an example wireless communication system, in accordance with various aspects and embodiments of the subject disclosure.

One or more embodiments are now described with reference to the drawings, wherein like reference numerals are used to refer to like elements throughout. In the following description, for purposes of explanation, numerous specific details are set forth in order to provide a thorough understanding of the various embodiments. It is evident, however, that the various embodiments can be practiced without these specific details, and without applying to any particular networked environment or standard.

One or more aspects of the technology described herein are generally directed towards a short message service (SMS) congestion manager that can evaluate, predict, and mitigate SMS congestion, and related network equipment and processing techniques. The SMS congestion manager can be implemented within a short message services function (SMSF) of a 5G or subsequent generation cellular network. The SMS congestion manager can monitor a volume of non-access stratum (NAS) SMS messages in order to detect potential overload conditions wherein the volume of messages exceeds a capability of a network function. In response to detecting potential overload conditions, the SMS congestion manager can inhibit messages directed to the network function in order to prevent overloads from developing. The SMS congestion manager can use machine learning to learn to detect the potential overload conditions as well as to learn actions to take to address the potential overload conditions. Further aspects and embodiments of this disclosure are described in detail below.

As used in this disclosure, in some embodiments, the terms "component," "system" and the like are intended to refer to, or comprise, a computer-related entity or an entity related to an operational apparatus with one or more specific functionalities, wherein the entity can be either hardware, a combination of hardware and software, software, or software in execution. As an example, a component can be, but is not limited to being, a process running on a processor, a processor, an object, an executable, a thread of execution, computer-executable instructions, a program, and/or a computer. By way of illustration and not limitation, both an application running on a server and the server can be a component.

One or more components can reside within a process and/or thread of execution and a component can be localized on one computer and/or distributed between two or more computers. In addition, these components can execute from various computer readable media having various data structures stored thereon. The components can communicate via local and/or remote processes such as in accordance with a signal having one or more data packets (e.g., data from one component interacting with another component in a local system, distributed system, and/or across a network such as the internet with other systems via the signal). As another example, a component can be an apparatus with specific functionality provided by mechanical parts operated by electric or electronic circuitry, which is operated by a software application or firmware application executed by a processor, wherein the processor can be internal or external to the apparatus and executes at least a part of the software or firmware application. As yet another example, a component can be an apparatus that provides specific functionality through electronic components without mechanical parts, the electronic components can comprise a processor therein to execute software or firmware that confers at least in part the functionality of the electronic components. While various components have been illustrated as separate components, it will be appreciated that multiple components can be implemented as a single component, or a single component can be implemented as multiple components, without departing from example embodiments.

The term "facilitate" as used herein is in the context of a system, device or component "facilitating" one or more actions or operations, in respect of the nature of complex computing environments in which multiple components and/or multiple devices can be involved in some computing operations. Non-limiting examples of actions that may or may not involve multiple components and/or multiple devices comprise transmitting or receiving data, establishing a connection between devices, determining intermediate results toward obtaining a result, etc. In this regard, a computing device or component can facilitate an operation by playing any part in accomplishing the operation. When operations of a component are described herein, it is thus to be understood that where the operations are described as facilitated by the component, the operations can be optionally completed with the cooperation of one or more other computing devices or components, such as, but not limited to, sensors, antennae, audio and/or visual output devices, other devices, etc.

Further, the various embodiments can be implemented as a method, apparatus or article of manufacture using standard programming and/or engineering techniques to produce software, firmware, hardware or any combination thereof to control a computer to implement the disclosed subject matter. The term "article of manufacture" as used herein is intended to encompass a computer program accessible from any computer-readable (or machine-readable) device or computer-readable (or machine-readable) storage/communications media. For example, computer readable storage media can comprise, but are not limited to, magnetic storage devices (e.g., hard disk, floppy disk, magnetic strips), optical disks (e.g., compact disk (CD), digital versatile disk (DVD)), smart cards, and flash memory devices (e.g., card, stick, key drive). Of course, those skilled in the art will recognize many modifications can be made to this configuration without departing from the scope or spirit of the various embodiments.

Moreover, terms such as "mobile device equipment," "mobile station," "mobile," "subscriber station," "access terminal," "terminal," "handset," "communication device," "mobile device" (and/or terms representing similar terminology) can refer to a wireless device utilized by a subscriber or mobile device of a wireless communication service to receive or convey data, control, voice, video, sound, gaming or substantially any data-stream or signaling-stream. The foregoing terms are utilized interchangeably herein and with reference to the related drawings. Likewise, the terms "access point (AP)," "Base Station (BS)," "BS transceiver," "BS device," "cell site," "cell site device," "gNode B (gNB)," "evolved Node B (eNode B, eNB)," "home Node B (HNB)" and the like, refer to wireless network components or appliances that transmit and/or receive data, control, voice, video, sound, gaming or substantially any data-stream or signaling-stream from one or more subscriber stations. Data and signaling streams can be packetized or frame-based flows.

Furthermore, the terms "device," "communication device," "mobile device," "subscriber," "customer entity," "consumer," "customer entity," "entity" and the like are employed interchangeably throughout, unless context warrants particular distinctions among the terms. It should be appreciated that such terms can refer to human entities or automated components supported through artificial intelligence (e.g., a capacity to make inference based on complex mathematical formalisms), which can provide simulated vision, sound recognition and so forth.

FIG. 1 illustrates a non-limiting example of a wireless communication system 100 which can be used in connection with at least some embodiments of the subject disclosure. In one or more embodiments, system 100 can comprise one or more user equipment UEs $102_1$, $102_2$, referred to collectively as UEs 102, a network node 104 that supports cellular communications in a service area 110, also known as a cell, and communication service provider network(s) 106.

The non-limiting term "user equipment" can refer to any type of device that can communicate with a network node 104 in a cellular or mobile communication system 100. UEs 102 can have one or more antenna panels having vertical and horizontal elements. Examples of UEs 102 comprise target devices, device to device (D2D) UEs, machine type UEs or UEs capable of machine to machine (M2M) communications, personal digital assistants (PDAs), tablets, mobile terminals, smart phones, laptop mounted equipment (LME), universal serial bus (USB) dongles enabled for mobile communications, computers having mobile capabilities, mobile devices such as cellular phones, laptops having laptop embedded equipment (LEE, such as a mobile broadband adapter), tablet computers having mobile broadband adapters, wearable devices, virtual reality (VR) devices, heads-up display (HUD) devices, smart cars, machine-type communication (MTC) devices, augmented reality head mounted displays, and the like. UEs 102 can also comprise IOT devices that communicate wirelessly.

In various embodiments, system 100 comprises communication service provider network(s) 106 serviced by one or more wireless communication network providers. Communication service provider network(s) 106 can comprise a "core network". In example embodiments, UEs 102 can be communicatively coupled to the communication service provider network(s) 106 via network node 104. The network node 104 (e.g., network node device) can communicate with UEs 102, thus providing connectivity between the UEs 102 and the wider cellular network. The UEs 102 can send transmission type recommendation data to the network node 104. The transmission type recommendation data can comprise a recommendation to transmit data via a closed loop multiple input multiple output (MIMO) mode and/or a rank-1 precoder mode.

A network node 104 can have a cabinet and other protected enclosures, computing devices, an antenna mast, and multiple antennas for performing various transmission operations (e.g., MIMO operations) and for directing/steering signal beams. Network node 104 can comprise one or more base station devices which implement features of the network node 104. Network nodes can serve several cells, depending on the configuration and type of antenna. In example embodiments, UEs 102 can send and/or receive communication data via a wireless link to the network node 104. The dashed arrow lines from the network node 104 to the UEs 102 represent downlink (DL) communications to the UEs 102. The solid arrow lines from the UEs 102 to the network node 104 represent uplink (UL) communications.

Communication service provider networks 106 can facilitate providing wireless communication services to UEs 102 via the network node 104 and/or various additional network devices (not shown) included in the one or more communication service provider networks 106. The one or more communication service provider networks 106 can comprise various types of disparate networks, including but not limited to: cellular networks, femto networks, picocell networks, microcell networks, internet protocol (IP) networks Wi-Fi service networks, broadband service networks, enterprise networks, cloud based networks, millimeter wave networks and the like. For example, in at least one implementation, system 100 can be or comprise a large scale wireless communication network that spans various geographic areas. According to this implementation, the one or more communication service provider networks 106 can be or comprise the wireless communication network and/or various additional devices and components of the wireless communication network (e.g., additional network devices and cell, additional UEs, network server devices, etc.).

The network node 104 can be connected to the one or more communication service provider networks 106 via one or more backhaul links 108. For example, the one or more backhaul links 108 can comprise wired link components, such as a T1/E1 phone line, a digital subscriber line (DSL) (e.g., either synchronous or asynchronous), an asymmetric DSL (ADSL), an optical fiber backbone, a coaxial cable, and the like. The one or more backhaul links 108 can also comprise wireless link components, such as but not limited to, line-of-sight (LOS) or non-LOS links which can comprise terrestrial air-interfaces or deep space links (e.g., satellite communication links for navigation). Backhaul links 108 can be implemented via a "transport network" in some embodiments. In another embodiment, network node 104 can be part of an integrated access and backhaul network. This may allow easier deployment of a dense network of self-backhauled 5G cells in a more integrated manner by building upon many of the control and data channels/procedures defined for providing access to UEs.

Wireless communication system 100 can employ various cellular systems, technologies, and modulation modes to facilitate wireless radio communications between devices (e.g., the UE 102 and the network node 104). While example embodiments might be described for 5G new radio (NR) systems, the embodiments can be applicable to any radio access technology (RAT) or multi-RAT system where the UE operates using multiple carriers, e.g., LTE FDD/TDD, GSM/GERAN, CDMA2000 etc.

For example, system 100 can operate in accordance with any 5G, next generation communication technology, or existing communication technologies, various examples of which are listed supra. In this regard, various features and functionalities of system 100 are applicable where the devices (e.g., the UEs 102 and the network device 104) of system 100 are configured to communicate wireless signals using one or more multi carrier modulation schemes, wherein data symbols can be transmitted simultaneously over multiple frequency subcarriers (e.g., OFDM, CP-OFDM, DFT-spread OFMD, UFMC, FMBC, etc.). The embodiments are applicable to single carrier as well as to multicarrier (MC) or carrier aggregation (CA) operation of the UE. The term carrier aggregation (CA) is also called (e.g. interchangeably called) "multi-carrier system", "multi-cell operation", "multi-carrier operation", "multi-carrier" transmission and/or reception. Note that some embodiments are also applicable for Multi RAB (radio bearers) on some carriers (that is data plus speech is simultaneously scheduled).

In various embodiments, system 100 can be configured to provide and employ 5G or subsequent generation wireless networking features and functionalities. 5G wireless communication networks are expected to fulfill the demand of exponentially increasing data traffic and to allow people and machines to enjoy gigabit data rates with virtually zero (e.g., single digit millisecond) latency. Compared to 4G, 5G supports more diverse traffic scenarios. For example, in addition to the various types of data communication between conventional UEs (e.g., phones, smartphones, tablets, PCs, televisions, internet enabled televisions, AR/VR head mounted displays (HMOs), etc.) supported by 4G networks, 5G networks can be employed to support data communication between smart cars in association with driverless car environments, as well as machine type communications (MTCs). Considering the drastic different communication needs of these different traffic scenarios, the ability to dynamically configure waveform parameters based on traffic scenarios while retaining the benefits of multi carrier modulation schemes (e.g., OFDM and related schemes) can provide a significant contribution to the high speed/capacity and low latency demands of 5G networks. With waveforms that split the bandwidth into several sub-bands, different types of services can be accommodated in different sub-bands with the most suitable waveform and numerology, leading to an improved spectrum utilization for 5G networks.

To meet the demand for data centric applications, features of 5G networks can comprise: increased peak bit rate (e.g., 20 Gbps), larger data volume per unit area (e.g., high system spectral efficiency—for example about 3.5 times that of spectral efficiency of long term evolution (LTE) systems), high capacity that allows more device connectivity both concurrently and instantaneously, lower battery/power consumption (which reduces energy and consumption costs), better connectivity regardless of the geographic region in which a user is located, a larger numbers of devices, lower infrastructural development costs, and higher reliability of the communications. Thus, 5G networks can allow for: data rates of several tens of megabits per second should be supported for tens of thousands of users, 1 gigabit per second to be offered simultaneously to tens of workers on the same office floor, for example; several hundreds of thousands of simultaneous connections to be supported for massive sensor deployments; improved coverage, enhanced signaling efficiency; reduced latency compared to LTE.

The 5G access network can utilize higher frequencies (e.g., >6 GHz) to aid in increasing capacity. Currently, much of the millimeter wave (mmWave) spectrum, the band of spectrum between 30 GHz and 300 GHz is underutilized. The millimeter waves have shorter wavelengths that range from 10 millimeters to 1 millimeter, and these mmWave signals experience severe path loss, penetration loss, and fading. However, the shorter wavelength at mmWave frequencies also allows more antennas to be packed in the same physical dimension, which allows for large-scale spatial multiplexing and highly directional beamforming.

Performance can be improved if both the transmitter and the receiver are equipped with multiple antennas. Multi-antenna techniques can significantly increase the data rates and reliability of a wireless communication system. The use of multiple input multiple output (MIMO) techniques, which was introduced in the 3GPP and has been in use (including with LTE), is a multi-antenna technique that can improve the spectral efficiency of transmissions, thereby significantly boosting the overall data carrying capacity of wireless systems. The use of MIMO techniques can improve mmWave communications and has been widely recognized as a potentially important component for access networks operating in higher frequencies. MIMO can be used for achieving diversity gain, spatial multiplexing gain and beamforming gain. For these reasons, MIMO systems are an important part of the 3rd and 4th generation wireless systems and are in use in 5G systems.

Figure 2:
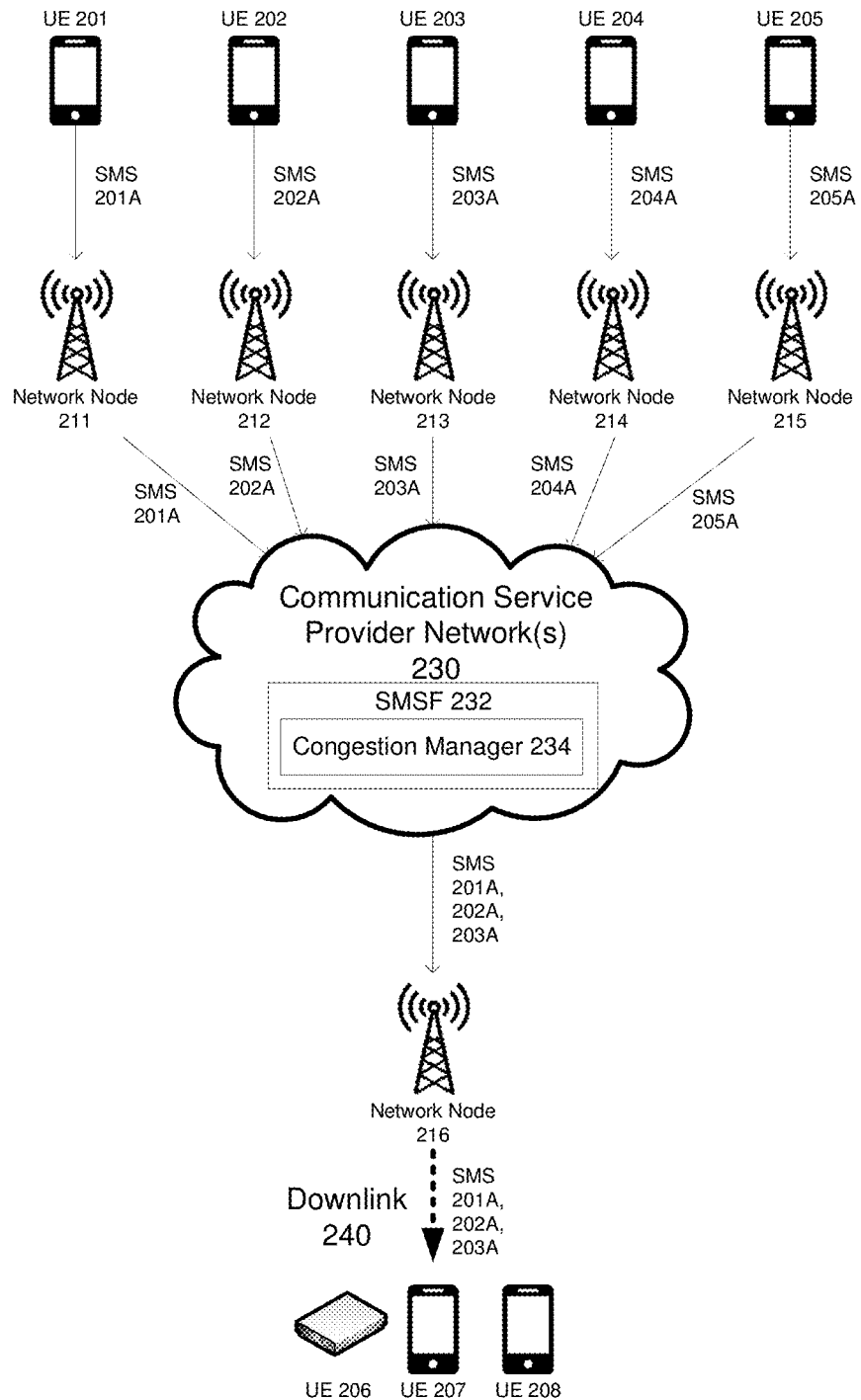
FIG. 2 illustrates example SMS congestion in a downlink and a congestion manager configured to address such congestion, in accordance with various aspects and embodiments of the subject disclosure.

FIG. 2 illustrates example SMS congestion in a downlink and a congestion manager configured to address such congestion, in accordance with various aspects and embodiments of the subject disclosure. FIG. 2 illustrates UEs 201, 202, 203, 204, 205, 206, 207, and 208 and network nodes 211, 212, 213, 214, 215, and 216. FIG. 2 furthermore illustrates communication service provider network(s) 230, wherein the communication service provider network(s) 230 comprise an SMSF 232, and wherein the SMSF 232 comprises a congestion manager 234 in addition to its usual functionalities, such as collecting and forwarding text messages. A downlink 240 is illustrated between the network node 216 and the UEs 206, 207, and 208.

In FIG. 2, the UEs 201, 202, 203, 204, 205, 206, 207, and 208 are examples of UEs 102 introduced in FIG. 1, the network nodes 211, 212, 213, 214, 215, and 216 are examples of the network node 104 introduced in FIG. 1, and the communication service provider network(s) 230 are an example of the communication service provider network(s) 106 introduced in FIG. 1. UE 206 is illustrated as an SMS server type UE, to which other UEs, e.g. UEs among 201, 202, 203, 204, 205 can send text messages comprising measurement data or alerts. The remaining illustrated UEs are represented as handsets, however can be implemented as any UE device such as described in connection with FIG. 1.

Each of the UEs 201, 202, 203, 204, and 205 is illustrated as being serviced by a different network node. Thus UE 201 is connected to network node 211, UE 202 is connected to network node 212, UE 203 is connected to network node 213, UE 204 is connected to network node 214, and UE 205 is connected to network node 215. In some embodiments, multiple of the UEs 201, 202, 203, 204, and 205 can instead be connected to any of the network nodes 211, 212, 213, 214, and 215. The number of UEs and network nodes is for illustration purposes and more or fewer UEs and network nodes can be involved in real-world embodiments.

Meanwhile, UEs 206, 207, and 208 are illustrated as being serviced by network node 216. The UEs 206, 207, and 208 can share downlink 240 as well as a cell and control plane channel supported by network node 216. A cell can comprise a single sector on a gNB/eNB which uses a particular frequency. When many SMS traffic sources, such as UEs 201, 202, 203, 204, and 205 send traffic to devices such as UEs 206, 207, and 208 that are attached to a same cell, there is a potential for overload of the cell, control plane channel, and/or downlink 240.

Each of the UEs 201, 202, 203, 204, and 205 is illustrated as sending an SMS message to UEs 206, 207, or 208. Thus UE 201 sends SMS 201A, UE 202 sends SMS 202A, UE 203 sends SMS 203A, UE 204 sends SMS 204A, and UE 205 sends SMS 205A. The respective UEs 201, 202, 203, 204, and 205 send the SMS messages 201A, 202A, 203A, 204A, and 205A via the respective network nodes 211, 212, 213, 214, and 215, and the network nodes 211, 212, 213, 214, and 215 provide the SMS messages 201A, 202A, 203A, 204A, and 205A to the communication service provider network(s) 230. The number of SMS messages is for illustration purposes and any of the UEs 201, 202, 203, 204, and 205 can send more or fewer SMS messages in some embodiments.

The communication service provider network(s) 230 comprise, inter alia, an SMSF 232 equipped with a congestion manager 234. The congestion manager 234 can monitor the volume of SMS messages, e.g., the volume of SMS messages comprising SMS messages 201A, 202A, 203A, 204A, and 205A and determine whether the volume of SMS messages presents a risk of overloading any network function(s). In the example illustrated in FIG. 2, the congestion manager 234 can determine whether the volume of SMS messages comprising SMS messages 201A, 202A, 203A, 204A, and 205A risks overloading the downlink 240.

In response to a potential overload, the SMSF 232 equipped with congestion manager 234 can take one or more actions to inhibit the SMS messages directed to the network function, e.g., the SMSF 232 equipped with congestion manager 234 can inhibit the SMS messages 201A, 202A, 203A, 204A, and 205A directed to the downlink 240. The SMSF 232 equipped with congestion manager 234 can use various possible actions to inhibit the SMS messages 201A, 202A, 203A, 204A, and 205A. For example, the SMSF 232 equipped with congestion manager 234 can drop or delay SMS messages that are directed to the network function (downlink 240). In FIG. 2, SMS 201A, 202A, and 203A are shown as being delivered to UEs 206, 207, or 208 via network node 216 and downlink 240. The SMSF 232 equipped with congestion manager 234 has dropped or delayed SMS 204A and 205A, to prevent overload of the downlink 240. The SMSF 232 equipped with congestion manager 234 can optionally take any of a variety of different actions and/or combinations of actions to inhibit SMS messages, as described herein.

In some embodiments, the congestion manager 234 can be configured to use machine learning in the SMSF 232 in order to analyze SMS messages from a large number of UEs such as 201-205. The congestion manager 234 can be configured to determine whether too many SMS messages (as may be determined by a threshold value or otherwise) are destined to downlink 240 within a particular transfer time interval (TTI), resulting in a potential overload. Similarly, the congestion manager 234 can determine whether too many SMS messages are destined to one network node 216 in a TTI. The congestion manager 234 can also optionally determine whether there is duplication of SMS messages. The congestion manager 234 can determine whether a particular device (e.g., one of UEs 201-205) or application is sending too many SMS messages. In some embodiments, mobility of UEs 201-205 can require analyzing data over multiple access and mobility management functions (AMFs) and SMSFs. The congestion manager 234 can learn patterns of SMS delivery to receiving UEs such as 206, 207, or 208. Advantageously, machine learning used to implement the congestion manager 234 can be trained on real-world data.

Example actions which the SMSF 232 equipped with congestion manager 234 can take to prevent overload conditions include introducing delay to stagger scheduling of SMS messages to subsequent TTIs. Furthermore, the SMSF 232 equipped with congestion manager 234 can optionally drop duplicate SMS messages. The SMSF 232 equipped with congestion manager 234 can optionally generate alerts in case of abnormal SMS activities. The SMSF 232 equipped with congestion manager 234 can optionally identify source and/or destination UEs involved in unusual patterns of SMS messages. The SMSF 232 equipped with congestion manager 234 can optionally instruct an AMF to block certain sources from sending SMS messages. The SMSF 232 equipped with congestion manager 234 can optionally drop SMS messages in response to buffer bloat in a radio link control (RLC) buffer of a receiving network node 216. In some embodiments, the SMSF 232 with congestion manager 234 can be built as a containerized network function in a network cloud, and the computing capacity of the SMSF 232 with congestion manager 234 can be elastically increased or decreased as needed, e.g., in response to increases and decreases in SMS traffic. In another embodiment, instead of or in addition to inhibiting SMS messages, the SMSF 232 with congestion manager 234 can optionally be configured to request additional network capacity for SMS traffic, e.g., the use of additional network nodes such as network node 216 on the receiving side.

Figure 3:
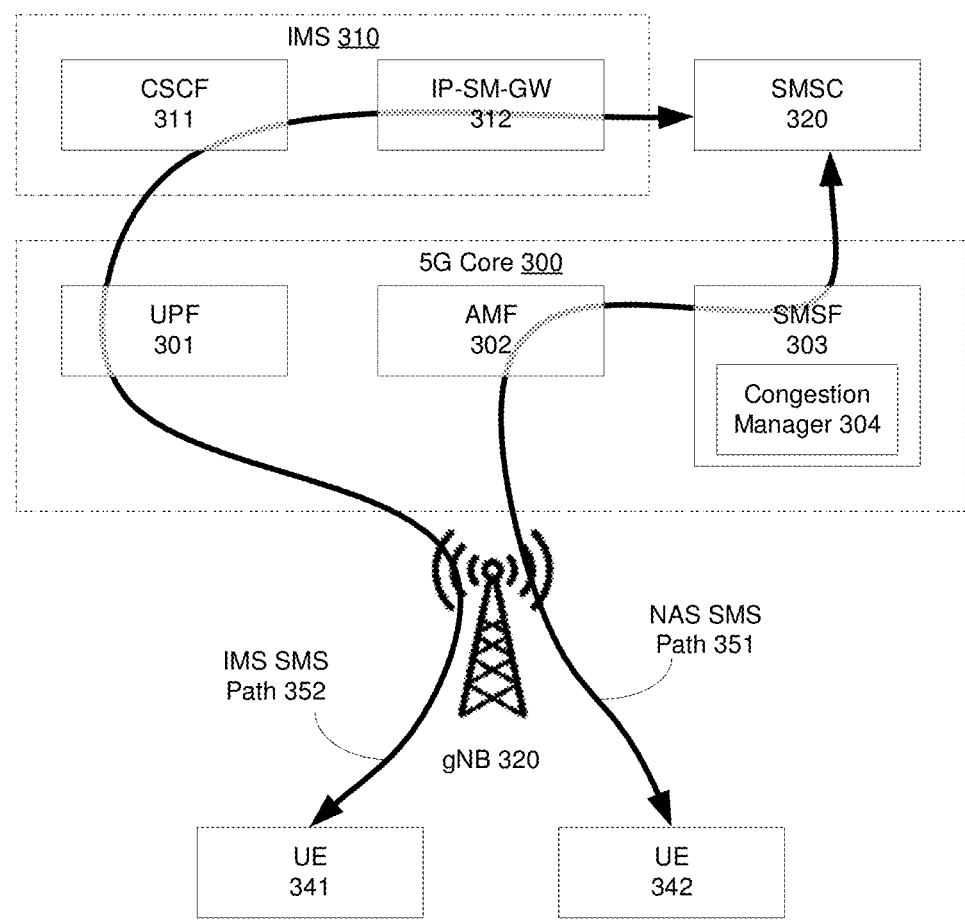
FIG. 3 illustrates an example NAS SMS path and an example IMS SMS path through various example network components, and example placement of a congestion manager in the NAS SMS path, in accordance with various aspects and embodiments of the subject disclosure.

FIG. 3 illustrates an example NAS SMS path and an example IMS SMS path through various example network components, and example placement of a congestion manager in the NAS SMS path, in accordance with various aspects and embodiments of the subject disclosure. FIG. 3 includes UEs 341 and 342, a 5G network node (gNB) 320, and example components of a communication service provider network, including components of an IMS 310, components of a 5G core 300, and a short message service center (SMSC) 320. The IMS 310 includes call session control function (CSCF) 311 and IP short message gateway (IP-SM-GW) 312. The 5G core 300 includes user plane function (UPF) 301, access and mobility management function (AMF) 302, and SMSF 303. The SMSF 303 includes a congestion manager 304.

In FIG. 3, the UEs 341 and 342 are examples of UEs 102 introduced in FIG. 1, the gNB 320 is an example of the network node 104 introduced in FIG. 1, and the IMS 310, 5G core 300, and SMSC 320 can be included in the communication service provider network(s) 106 introduced in FIG. 1. The SMSF 303 is an example of the SMSF 232 introduced in FIG. 2, and the congestion manager 304 is an example of the congestion manager 234 introduced in FIG. 2.

FIG. 3 illustrates an IMS SMS path 352 and a NAS SMS path 351. NAS type SMS messages are processed via the NAS SMS path 351, while IMS type SMS messages are processed via the IMS SMS path 352. The NAS SMS path 351 includes the UE 342, the gNB 320, the AMF 302, the SMSF 303, and the SMSC 320. The IMS SMS path 352 includes the UE 341, the gNB 320, the UPF 301, the CSCF 311, the IP-SM-GW 312, and the SMSC 320.

This disclosure proposes the 3GPP-defined 5G SMSF 303 as a congestion mitigation point that can host the congestion manager 304. In the 5G network architecture, the SMSF 303 resides between SMSC 320 and the AMF 302. The AMF 302 is connected to the Radio Access Network (RAN) which includes the gNB 320. The SMSC 320 directs all SMS to SMSF 303, which forwards them to AMF; then AMF in turn forwards them over NAS to recipients such as UE 342. Thus, the SMSF 303 provides an advantageous point in the network to deploy congestion manager 304 to mitigate NAS type SMS congestion, e.g. in response to unacceptably large volumes of SMS messages due to malicious or unusual events. The congestion manager 304 can be trained by real data to predict congestion in the NAS SMS path 351 and take mitigating/inhibiting actions, such as dropping SMS messages, delaying SMS messages, and generating alerts. While the SMSF 303 thus provides a network location for congestion manager 304 in some embodiments, the congestion manager 304 can optionally be located in another part of the communication service provider network, and not in the SMSF 303 in other alternative embodiments, so long as the congestion manager 304 can receive information regarding SMS volume from SMSF 303.

The SMSF 303 can support the following example functionality for SMS over NAS: SMS management subscription data checking and conducting SMS delivery; short message relay protocol (SM-RP) and short message control protocol (SM-CP) communications with the UE 342; relay of short messages (SM) from the SMSC 320 toward UE 342 and vice versa; collection of SMS related call detail records (CDR); lawful Interception; and interactions with AMF 302 and SMSC 320 with regard to notification procedures when the UE 342 is unavailable for SMS transfer (e.g., the SMSF 303 can tell SMSC 320 to inform a unified data manager (UDM) when UE 342 is unavailable for SMS messaging).

With the introduction of 5G, there will be an increasing number of cellular devices, and IoT devices in particular, that will communicate using the NAS SMS path 351. The IoT device density in 5G networks is forecast to grow ten-fold compared to 4G networks. We are at the threshold of a digital age where smart cities, intelligent manufacturing, autonomous vehicles and other such networked intelligent machines will become the norm. IoT devices including sensor networks will be a major enabler of such technology. However, due to the massive number and high geographic density of SMS-enabled sensors the 5G RAN control plane is at risk of congestion. Thus, this disclosure provides an effective automatic mitigation scheme that can detect anomalous traffic patterns that are likely to cause congestion in the RAN control plane, and take appropriate action.

In some embodiments, the SMSF 303 can be leveraged as a point of mitigation for SMS "storms" directed towards a device or group of devices, such as UE 342, or such as a central server or IoT device to which SMS messages 201A, 202A, 203A, 204A, and 205A may be directed. The SMSC 320 can send SMS messages to an SMSF 303, and the SMSF 303 can be responsible for delivering SMS messages to UE 342, or a recipient server or other device.

In some embodiments, SMSF 303 and congestion manager 304 can be configured to collect and examine metadata of SMS messages sent via the NAS SMS path 351. The congestion manager 304 can be implemented using machine learning to mitigate possible congestion of the control plane caused by attacks originating from IoT devices or other UEs 201-205 as shown in FIG. 2. Different SMSFs can serve different geographic areas, so the SMSF 303 is a point at which normal SMS traffic patterns to destination devices, such as UE 342, can be learned. Machine learning can optionally be used to categorize and prioritize destination devices, e.g., UE 342, served by each SMSF 303. This allows the SMSF 303 to learn to selectively serve only the most important SMS traffic during a SMS storm.

Figure 4:
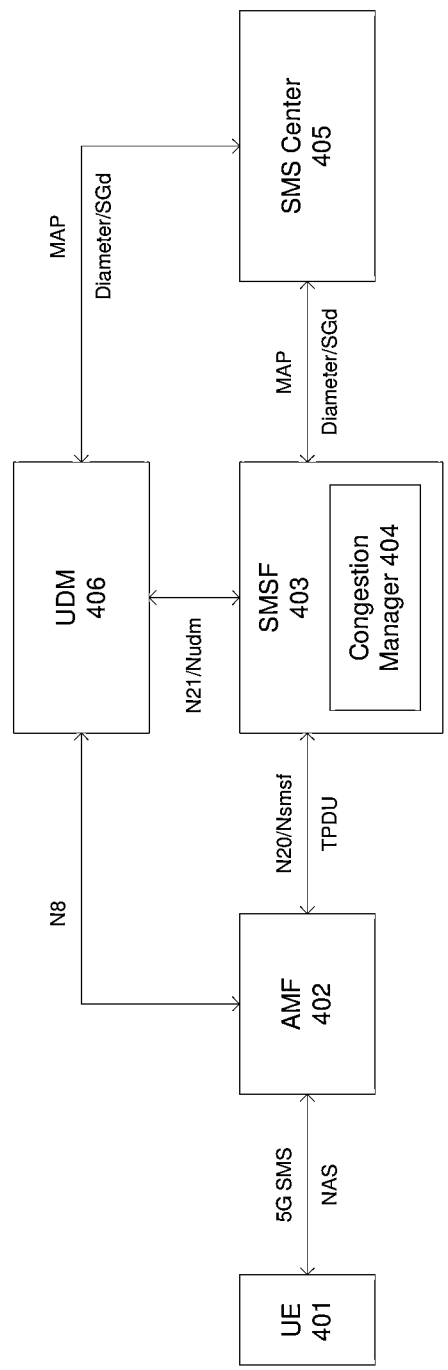
FIG. 4 illustrates an example short message services function (SMSF) comprising a congestion manager, and interactions of the SMSF with other components of a cellular communication network, in accordance with various aspects and embodiments of the subject disclosure.

FIG. 4 illustrates an example SMSF comprising a congestion manager, and interactions of the SMSF with other components of a cellular communication network, in accordance with various aspects and embodiments of the subject disclosure. FIG. 4 includes a UE 401, an AMF 402, an SMSF 403, an SMS center 405, and a UDM 406. The SMSF 403 comprises a congestion manager 404.

In FIG. 4, the UE 401 can communicate with the AMF 402 using 5G SMS and NAS protocols. The AMF 402 can communicate with the SMSF 403 using N20/Nsmsf and transport protocol data unit (TPDU) protocols. The AMF 402 can communicate with the UDM 406 using an N8 protocol. The SMSF 403 can communicate with the UDM 406 using an N21/Nudm protocol. The SMSF 403 can communicate with the SMS center 405 using a MAP and diameter/SGd protocol. The SMS center 405 can communicate with the UDM 406 using a MAP and diameter/SGd protocol.

In FIG. 4, the UE 401 is an example of UEs 102 introduced in FIG. 1, the AMF 402 is an example of the AMF 302 introduced in FIG. 3, and the SMS center 405 is an example of the SMSC 320 introduced in FIG. 3. The SMSF 403 is an example of the SMSF 232 introduced in FIG. 2, and the congestion manager 404 is an example of the congestion manager 234 introduced in FIG. 2. The SMSF 403 can be configured to convert text messages from the diameter protocols to hypertext transfer protocol (HTTP) based TPDU protocols, and vice versa. The SMSF 403 can provide a SMS gateway message service center (GMSC), comprising a gateway for routing text messages to the SMS center 405. The SMSF 403 can be configured to store text messages for a period of time and congestion manager 404 can be trained on the stored text messages and/or text message metadata and text message volume information.

Figure 5:
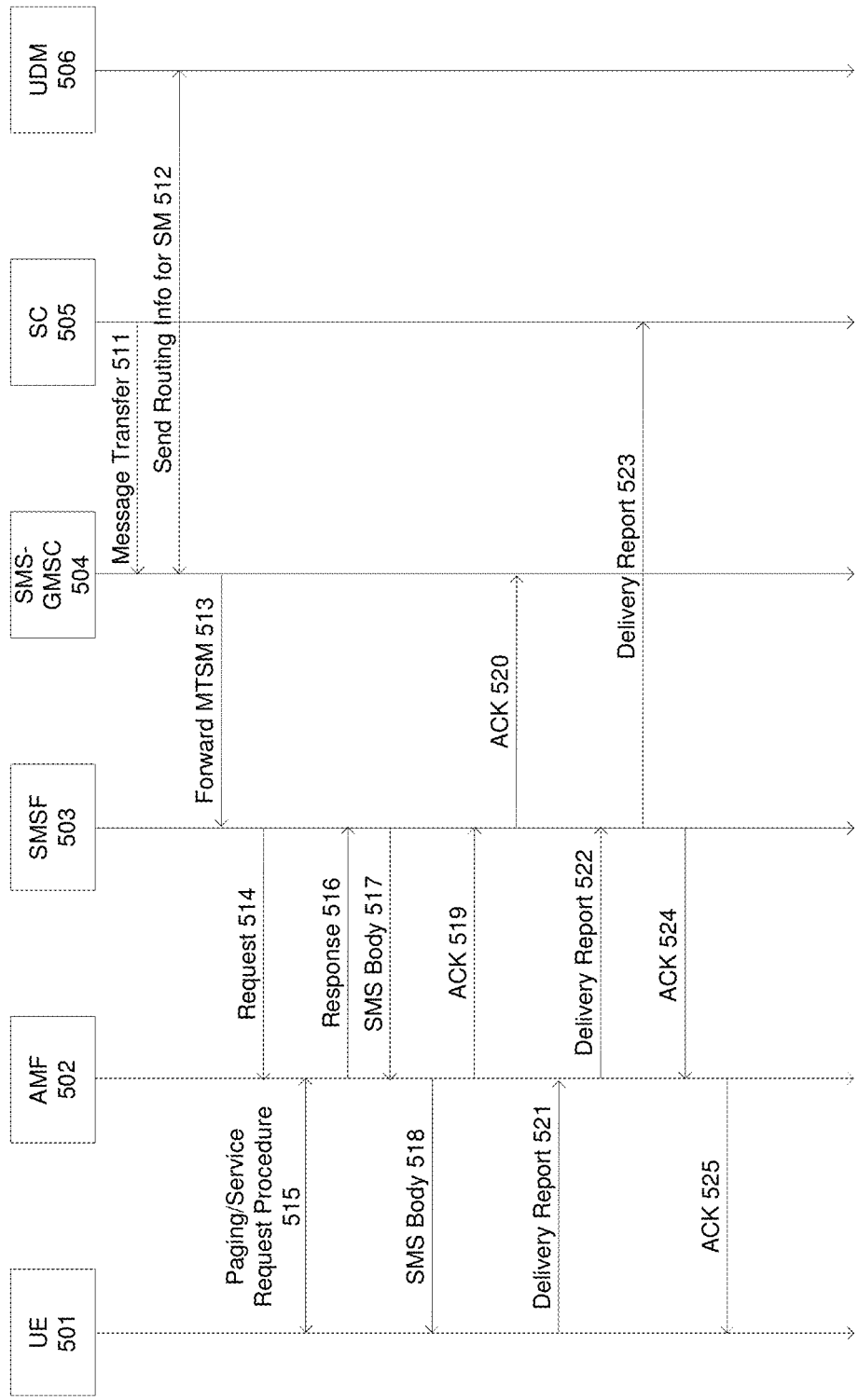
FIG. 5 illustrates an example mobile terminated SMS call flow, in accordance with various aspects and embodiments of the subject disclosure.

FIG. 5 illustrates an example mobile terminated SMS (MTSMS) call flow, in accordance with various aspects and embodiments of the subject disclosure. FIG. 5 includes a UE 501, an AMF 502, an SMSF 503, an SMS-GMSC 504, an actual service center (SC) 505 of an SMSC, and a UDM 506. The illustrated call flow comprises message transfer 511, send routing info for SM 512, forward to MTSM 513, request 514, paging/service request procedure 515, response 516, SMS body 517, SMS body 518, ACK 519, ACK 520, delivery report 521, delivery report 522, delivery report 523, ACK 524, and ACK 525.

In further detail, the illustrated request 514 can comprise an Namf_MT_enable reachability request. The illustrated response 516 can comprise an Namf_MT_enable reachability response. The illustrated SMS body 517 can comprise an Namf_communication_N1N2 message transfer. The illustrated SMS body 518 can comprise a downlink NAS transport. The illustrated ACK 519 can comprise an uplink NAS transport acknowledgement. The illustrated ACK 520 can comprise an Nsmsf_SMService_UplinkSMS acknowledgement. The delivery report 521 can comprise an uplink NAS transport. The delivery report 522 can comprise an Nsmsf_SMService_UplinkSMS message. The ACK 524 can comprise an Namf_Communication_N1N2 message transfer. The ACK 525 can comprise a downlink NAS transport.

In some embodiments, any or all of the SMSF 503 operations 513, 514, 516, 517, 519, 520, 522, 523, and 524 can be leveraged to collect data that can subsequently be used by a congestion manager 404 to learn information regarding SMS message volume and potential overloads of radio channels, as well as to learn actions that can be used to inhibit SMS messages to prevent overloads from occurring.

Figures 6A, 6B:
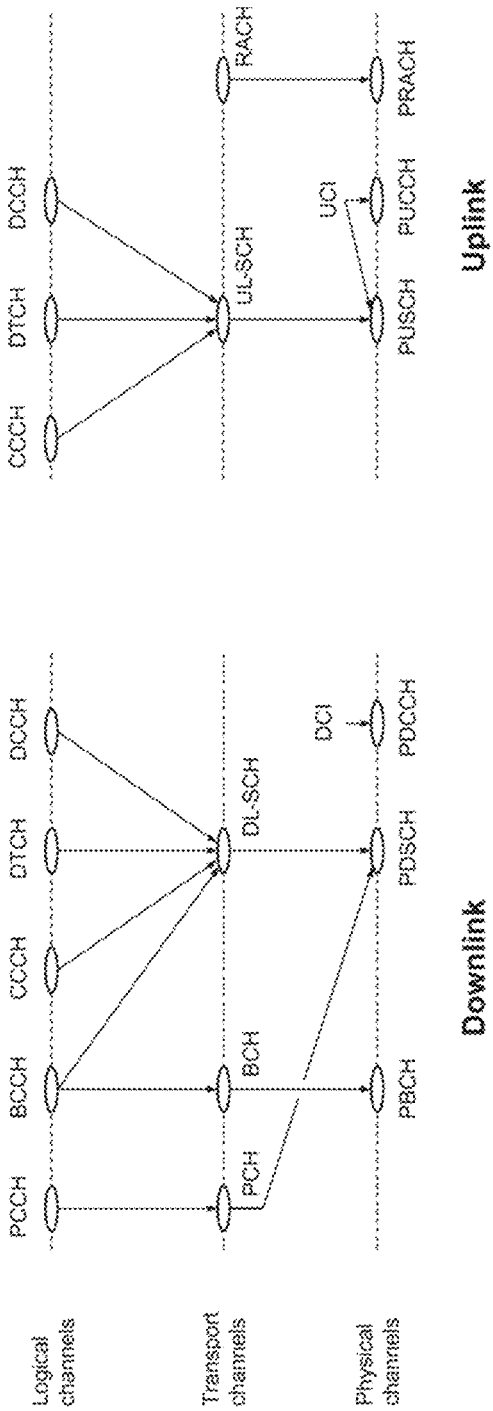
FIG. 6A illustrates an example dedicated control channel (DCCH) mapping for downlink communications, in accordance with various aspects and embodiments of the subject disclosure.
FIG. 6B illustrates an example DCCH mapping for uplink communications, in accordance with various aspects and embodiments of the subject disclosure.

FIG. 6A illustrates an example dedicated control channel (DCCH) mapping for downlink communications, in accordance with various aspects and embodiments of the subject disclosure, and FIG. 6B illustrates an example DCCH mapping for uplink communications, in accordance with various aspects and embodiments of the subject disclosure. In FIG. 6A and FIG. 6B, logical channels, transport channels, and physical channels are shown.

FIG. 6A shows a mapping of logical channels including paging control channel (PCCH), broadcast control channel (BCCH), common control channel (CCCH), dedicated traffic channel (DTCH), and DCCH to transport channels including paging channel (PCH), broadcast channel (BCH), and downlink shared channel (DL-SCH). The transport channels PCH, BCH, and DL-SCH are mapped to physical channels including physical broadcast channel (PBCH), physical downlink shared channel (PDSCH), and physical downlink control channel (PDCCH). The PDCCH can use downlink control information (DCI).

FIG. 6B shows a mapping of logical channels CCCH, DTCH, and DCCH to a transport channel including uplink shared channel (UL-SCH). The UL-SCH transport channel is mapped to a physical channel including physical uplink shared channel (PUSCH). A physical uplink control channel (PUCCH), and physical random access channel (PRACH) are also used in the physical plane. The PUSCH and PUCCH can use uplink control information (UCI), and the PRACH can use a random access channel (RACH) as shown.

In FIG. 6A and FIG. 6B, the DCCH represents a logical channel used within the uplink and downlink to carry dedicated control information between the UE and the network, after a radio resource control (RRC) connection has been established. SMS over NAS is handled by DCCH, a logical control channel, which carries SMS payloads as well as registration and activation control requests. DCCH is mapped to the PDSCH for downlink NAS communications.

One implication of the mappings illustrated in FIGS. 6A and 6B is the potential for overload of a PDSCH in particular, which can result from the logical channels that are mapped to the PDSCH as shown. Therefore, embodiments of congestion manager 404 disclosed herein can monitor the PDSCH radio channel and/or channels upstream of the PDSCH network function for potential overload of the PDSCH. Other embodiments can optionally monitor uplink channels illustrated in FIG. 6B, however, overload is generally considered less likely in the uplink channels.

A large number of IoT devices utilizing SMS over NAS can create congestion on DCCH related channels, which are also utilized for UE registration and other purposes, thereby creating a denial of service (DoS) scenario. To remedy this, congestion in the PDSCH downlink channel by SMS over NAS can be modeled by machine learning in the SMSF, which can reduce congestion by discarding or otherwise inhibiting SMS text messages destined to affected gNBs.

In an example assessment of potential PDSCH overload, resource elements allocated for PDSCH can comprise 100 resource blocks, each comprising 12 sub-carriers and 11 symbols. Subtract five symbols of the 12 sub-carriers, for six of the resource blocks, which are allocated for other purposes. The result is 12840 symbols. At 6 bits per symbol for 64 quadrature amplitude modulation (QAM), a PDSCH can thus transfer a maximum of 12840×6, equal to 77040 bits in a sub-frame. An average SMS size is 40 bytes, or 320 bits. Therefore, a maximum number messages in a sub-frame is 77040/320, or 240 SMS messages. Embodiments of this disclosure can use this threshold, or other, similarly calculated thresholds as may be appropriate, to assess whether a PDSCH is at risk of an overload.

Figure 7:
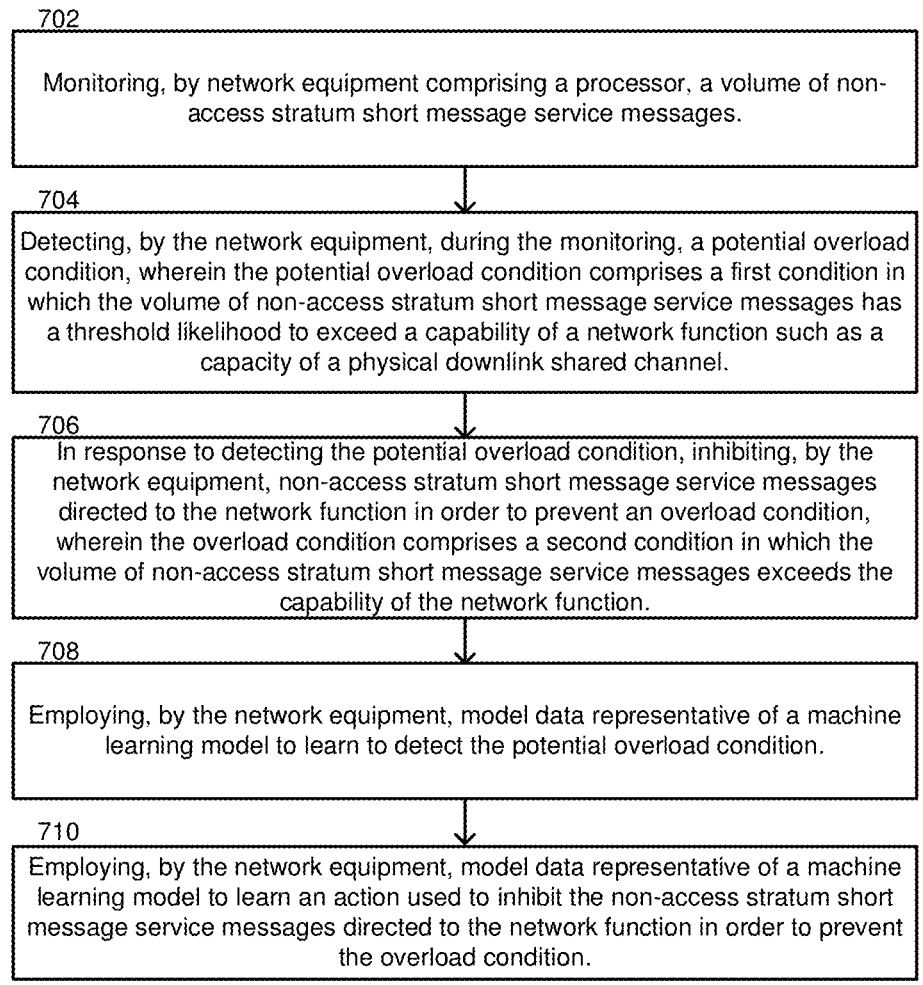
FIG. 7 is a flow diagram representing example operations of network equipment in connection with detecting and responding to potential overloads related to NAS SMS messages, in accordance with various aspects and embodiments of the subject disclosure.

FIG. 7 is a flow diagram representing example operations of network equipment in connection with detecting and responding to potential overloads related to NAS SMS messages, in accordance with various aspects and embodiments of the subject disclosure. The illustrated blocks can represent actions performed in a method, functional components of a computing device, or instructions implemented in a machine-readable storage medium executable by a processor. While the operations are illustrated in an example sequence, the operations can be eliminated, combined, or re-ordered in some embodiments.

The operations illustrated in FIG. 7 can be performed, for example, by network equipment comprising an SMSF 232 equipped with a congestion manager 234 such as illustrated in FIG. 2. Example operation 702 comprises monitoring, by network equipment comprising a processor, a volume of non-access stratum (NAS) short message service (SMS) messages. For example, the SMSF 232 can monitor an overall number of SMS messages 201A, 202A, 203A, 204A, and 205A being processed in a given time window.

Example operation 704 comprises detecting, by the network equipment, during the monitoring, a potential overload condition, wherein the potential overload condition comprises a first condition in which the volume of NAS SMS messages has a threshold likelihood to exceed a capability of network function, such as a capacity of a physical downlink shared channel. For example, the SMSF 232 can detect a potential overload of a network function that communicates via a PDSCH used in downlink 240.

A threshold likelihood to exceed a capability of the downlink 240 can occur, e.g., when the volume of NAS SMS messages is near the full capability of the downlink 240, such as by being at 90%, 95%, 98%, or over 99% of the downlink 240 capability. In some embodiments, the capability of the PDSCH can comprise a maximum number of bits included in subframes transmitted via the PDSCH.

Example operation 706 comprises, in response to detecting the potential overload condition pursuant to operation 704, inhibiting, by the network equipment, NAS SMS messages directed to the network function in order to prevent an overload condition, wherein the overload condition comprises a second condition in which the volume of NAS SMS messages exceeds the capability of the network function. For example, the SMSF 232 can inhibit one or more of SMS messages 201A, 202A, 203A, 204A, and 205A by delaying or deleting the SMS messages, or taking the other actions described herein. The SMSF 232 can thereby prevent overload of the downlink 240.

Example operation 708 comprises employing, by the network equipment, model data representative of a machine learning model to learn to detect the potential overload condition. For example, machine learning can be used to support operation 704, by learning what network conditions present potential overload conditions having the threshold likelihood to exceed capability of the downlink 240.

Example operation 710 comprises employing, by the network equipment, model data representative of a machine learning model to learn an action used to inhibit the NAS SMS messages directed to the network function in order to prevent the overload condition. For example, machine learning can be used to support operation 706, by learning which actions succeed in preventing the overload of the downlink 240 with minimal impact on legitimate SMS traffic. Example actions to inhibit NAS SMS messages include delaying transmission of at least one of the NAS SMS messages, omitting transmission of a duplicate NAS SMS message, and blocking a source of the NAS SMS messages, such as blocking a UE 201 from sending further SMS messages to UE 206.

Figure 8:
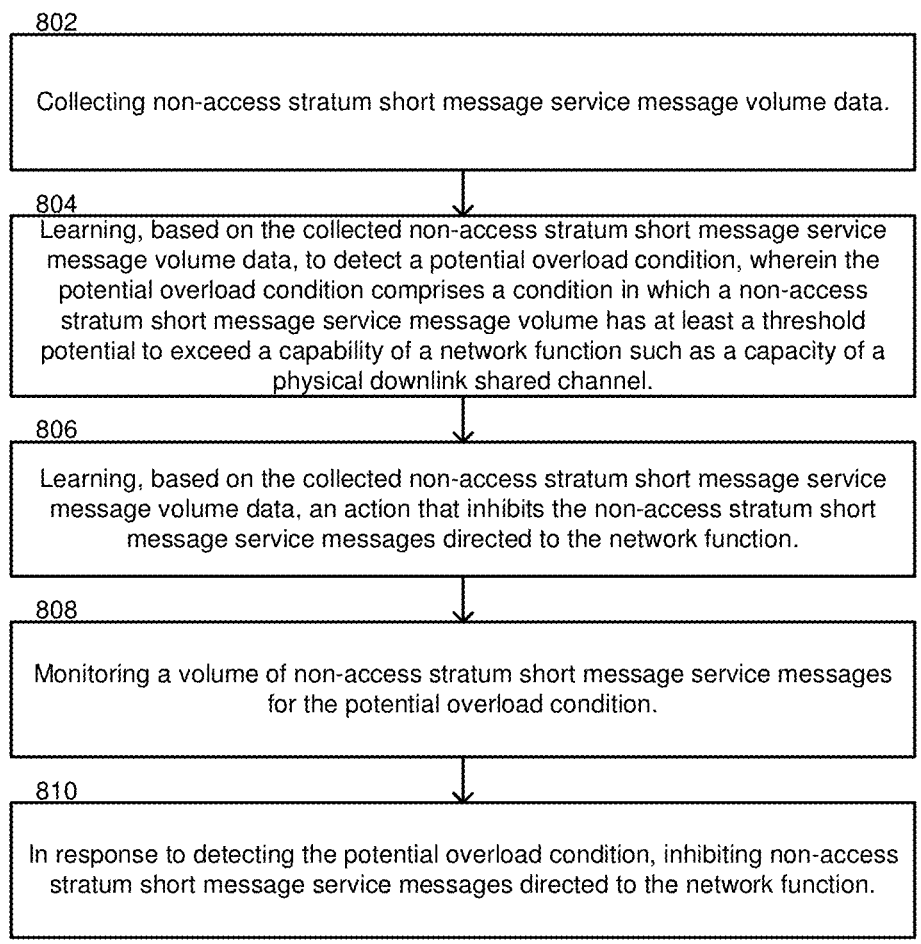
FIG. 8 is a flow diagram representing example operations of network equipment in connection with learning to recognize and respond to potential overloads related to NAS SMS messages, in accordance with various aspects and embodiments of the subject disclosure.

FIG. 8 is a flow diagram representing example operations of network equipment in connection with learning to recognize and respond to potential overloads related to NAS SMS messages, in accordance with various aspects and embodiments of the subject disclosure. The illustrated blocks can represent actions performed in a method, functional components of a computing device, or instructions implemented in a machine-readable storage medium executable by a processor. While the operations are illustrated in an example sequence, the operations can be eliminated, combined, or re-ordered in some embodiments.

The operations illustrated in FIG. 8 can be performed, for example, by network equipment comprising an SMSF 232 equipped with a congestion manager 234 such as illustrated in FIG. 2. The congestion manager 234 can be configured to perform the illustrated collecting, learning, monitoring and inhibiting operations. Example operation 802 comprises collecting NAS SMS message volume data. For example, the congestion manager 234 can be configured to temporarily store SMS message metadata from SMS messages 201A, 202A, 203A, 204A, and 205A, allowing determinations regarding the number of SMS messages to be processed, the sources of the SMS messages, the network functions involved in processing the SMS messages, and the destinations of the SMS messages.

Example operation 804 comprises learning, based on the collected NAS SMS message volume data, to detect a potential overload condition, wherein the potential overload condition comprises a condition in which a NAS SMS message volume has at least a threshold potential to exceed a capability of a network function such as a capacity of a physical downlink shared channel. For example, machine learning can be used to learn when the volume of SMS messages 201A, 202A, 203A, 204A, and 205A is close, e.g., as determined by a threshold potential, to exceeding capability of a network function such as the PDSCH used in the downlink 240.

Example operation 806 comprises learning, based on the collected NAS SMS message volume data, an action that inhibits the NAS SMS messages directed to the network function. For example, machine learning can be used to learn one or more actions that inhibit SMS messages to prevent overload of the downlink 240, as well as the effects of such actions on the volume of SMS messages processed by the downlink 240.

Example operation 808 comprises monitoring a volume of NAS SMS messages for the potential overload condition. For example, the SMSF 232 equipped with the congestion manager 234 can monitor the overall number of SMS messages 201A, 202A, 203A, 204A, and 205A directed to the downlink 240 to determine whether the volume of NAS SMS messages meets the potential overload condition learned at operation 804. Other data and network conditions can optionally be monitored in addition to or instead of the overall number of SMS messages.

Example operation 810 comprises, in response to detecting the potential overload condition, inhibiting NAS SMS messages directed to the network function. For example, the SMSF 232 equipped with the congestion manager 234 can inhibit one or more of NAS SMS messages 201A, 202A, 203A, 204A, and 205A. The action taken to inhibit the SMS messages can be an action learned at operation 806. In some embodiments, the action can be selected based on the data or network conditions that make up the potential overload condition. Example actions to inhibit NAS SMS messages include delaying at least one of the NAS SMS messages, dropping a duplicate NAS SMS message, and blocking a source of the NAS SMS messages, as described herein.

Figure 9:
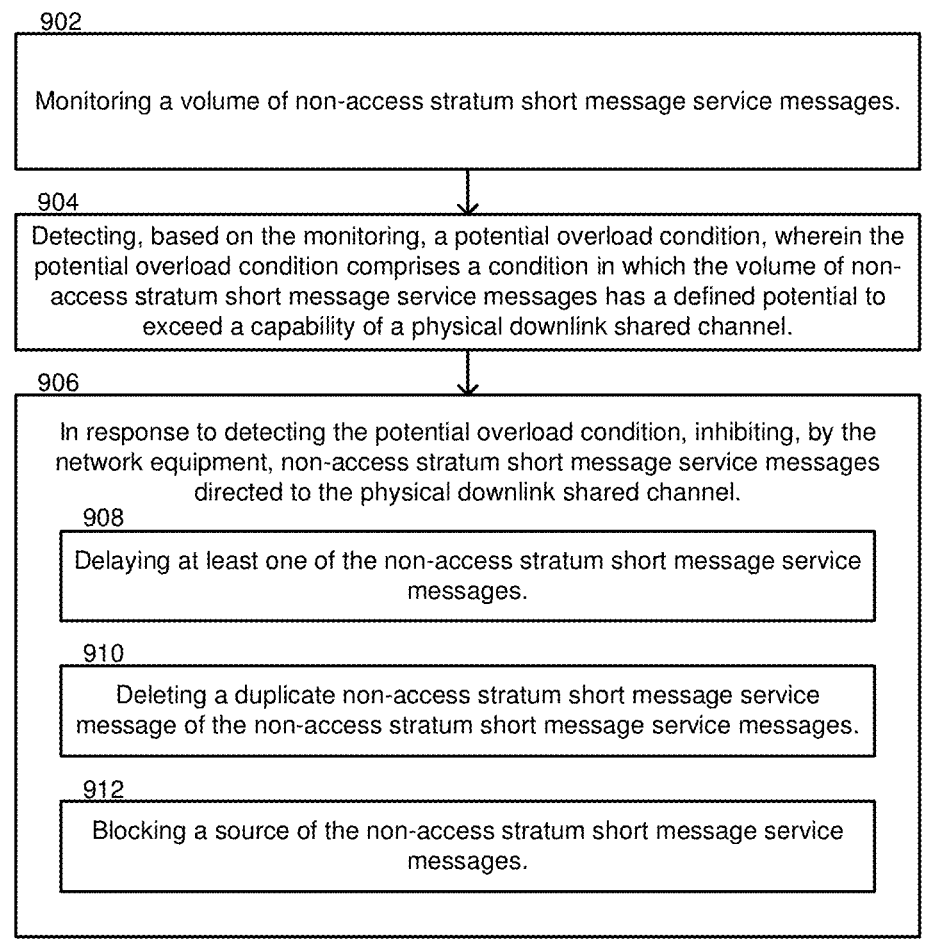
FIG. 9 is a flow diagram representing another group of example operations of network equipment in connection with detecting and responding to potential overloads related to NAS SMS messages, in accordance with various aspects and embodiments of the subject disclosure.

FIG. 9 is a flow diagram representing another group of example operations of network equipment in connection with detecting and responding to potential overloads related to NAS SMS messages, in accordance with various aspects and embodiments of the subject disclosure. The illustrated blocks can represent actions performed in a method, functional components of a computing device, or instructions implemented in a machine-readable storage medium executable by a processor. While the operations are illustrated in an example sequence, the operations can be eliminated, combined, or re-ordered in some embodiments.

The operations illustrated in FIG. 9 can be performed, for example, by network equipment comprising an SMSF 232 equipped with a congestion manager 234 such as illustrated in FIG. 2. Example operation 902 comprises monitoring a volume of NAS SMS messages. For example, the SMSF 232 equipped with congestion manager 234 can monitor an overall number of SMS messages 201A, 202A, 203A, 204A, and 205A being processed per unit of time and directed at different destinations such as UE 206, or another destination device.

Example operation 904 comprises detecting, based on the monitoring, a potential overload condition, wherein the potential overload condition comprises a condition in which the volume of NAS SMS messages has a defined potential to exceed a capability of a PDSCH. For example, the SMSF 232 equipped with congestion manager 234 can detect a condition wherein a PDSCH used in downlink 240 may exceed its capability, according to any defined potential risk of exceeding. The capability of the PDSCH can comprise, e.g., a maximum number of bits included in subframes transmitted on the PDSCH. A machine learning process can be advantageously used to learn to detect the potential overload condition.

Example operation 906 comprises in response to detecting the potential overload condition pursuant to operation 904, inhibiting, by the network equipment, NAS SMS messages directed to the PDSCH. Operation 906 can comprise any one of, or any combination of example operations 908, 910, or 912. Example operation 908 includes delaying at least one of the NAS SMS messages; example operation 910 includes deleting a duplicate NAS SMS message; and example operation 912 includes blocking a source of the NAS SMS messages.

Figure 10:
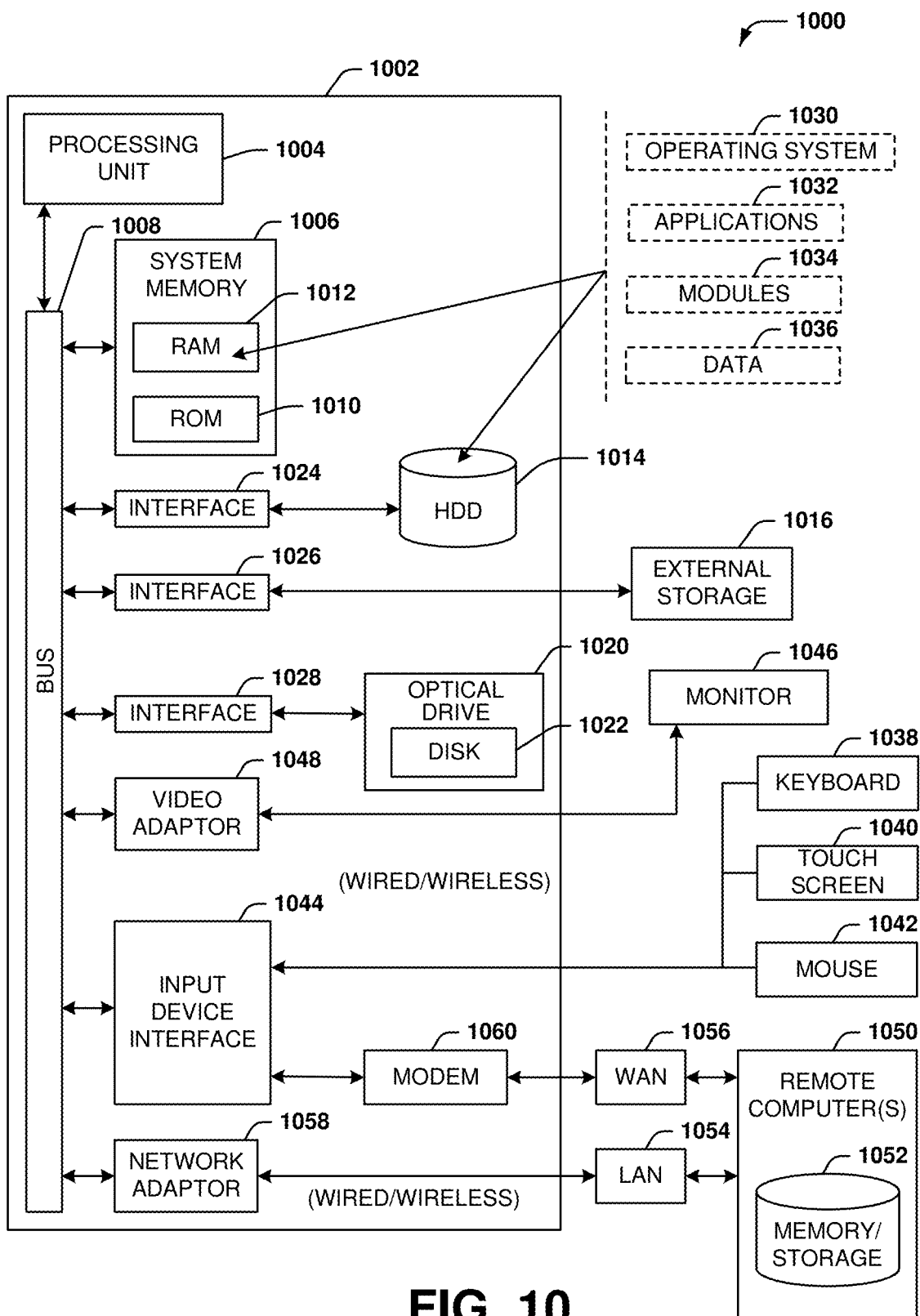
FIG. 10 is a block diagram of an example computer that can be operable to execute processes and methods in accordance with various aspects and embodiments of the subject disclosure.

FIG. 10 is a block diagram of an example computer that can be operable to execute processes and methods in accordance with various aspects and embodiments of the subject disclosure. The example computer can be adapted to implement, for example, any of the various network equipment described herein.

FIG. 10 and the following discussion are intended to provide a brief, general description of a suitable computing environment 1000 in which the various embodiments of the embodiment described herein can be implemented. While the embodiments have been described above in the general context of computer-executable instructions that can run on one or more computers, those skilled in the art will recognize that the embodiments can be also implemented in combination with other program modules and/or as a combination of hardware and software.

Generally, program modules include routines, programs, components, data structures, etc., that perform particular tasks or implement particular abstract data types. Moreover, those skilled in the art will appreciate that the methods can be practiced with other computer system configurations, including single-processor or multiprocessor computer systems, minicomputers, mainframe computers, IoT devices, distributed computing systems, as well as personal computers, hand-held computing devices, microprocessor-based or programmable consumer electronics, and the like, each of which can be operatively coupled to one or more associated devices.

The illustrated embodiments depicted herein can be also practiced in distributed computing environments where certain tasks are performed by remote processing devices that are linked through a communications network. In a distributed computing environment, program modules can be located in both local and remote memory storage devices.

Computing devices typically include a variety of media, which can include computer-readable storage media, machine-readable storage media, and/or communications media, which two terms are used herein differently from one another as follows. Computer-readable storage media or machine-readable storage media can be any available storage media that can be accessed by the computer and includes both volatile and nonvolatile media, removable and non-removable media. By way of example, and not limitation, computer-readable storage media or machine-readable storage media can be implemented in connection with any method or technology for storage of information such as computer-readable or machine-readable instructions, program modules, structured data or unstructured data.

Computer-readable storage media can include, but are not limited to, random access memory (RAM), read only memory (ROM), electrically erasable programmable read only memory (EEPROM), smart card, flash memory (e.g., card, stick, key drive) or other memory technology, compact disk (CD), compact disk read only memory (CD-ROM), digital versatile disk (DVD), Blu-ray™ disc (BD) or other optical disk storage, floppy disk storage, hard disk storage, magnetic cassettes, magnetic strip(s), magnetic tape, magnetic disk storage or other magnetic storage devices, solid state drives or other solid state storage devices, a virtual device that emulates a storage device (e.g., any storage device listed herein), or other tangible and/or non-transitory media which can be used to store desired information. In this regard, the terms "tangible" or "non-transitory" herein as applied to storage, memory or computer-readable media, are to be understood to exclude only propagating transitory signals per se as modifiers and do not relinquish rights to all standard storage, memory or computer-readable media that are not only propagating transitory signals per se.

Computer-readable storage media can be accessed by one or more local or remote computing devices, e.g., via access requests, queries or other data retrieval protocols, for a variety of operations with respect to the information stored by the medium.

Communications media typically embody computer-readable instructions, data structures, program modules or other structured or unstructured data in a data signal such as a modulated data signal, e.g., a carrier wave or other transport mechanism, and includes any information delivery or transport media. The term "modulated data signal" or signals refers to a signal that has one or more of its characteristics set or changed in such a manner as to encode information in one or more signals. By way of example, and not limitation, communication media include wired media, such as a wired network or direct-wired connection, and wireless media such as acoustic, RF, infrared and other wireless media.

With reference again to FIG. 10, the example environment 1000 for implementing various embodiments of the aspects described herein includes a computer 1002, the computer 1002 including a processing unit 1004, a system memory 1006 and a system bus 1008. The system bus 1008 couples system components including, but not limited to, the system memory 1006 to the processing unit 1004. The processing unit 1004 can be any of various commercially available processors. Dual microprocessors and other multi-processor architectures can also be employed as the processing unit 1004.

The system bus 1008 can be any of several types of bus structure that can further interconnect to a memory bus (with or without a memory controller), a peripheral bus, and a local bus using any of a variety of commercially available bus architectures. The system memory 1006 includes ROM 1010 and RAM 1012. A basic input/output system (BIOS) can be stored in a non-volatile memory such as ROM, erasable programmable read only memory (EPROM), EEPROM, which BIOS contains the basic routines that help to transfer information between elements within the computer 1002, such as during startup. The RAM 1012 can also include a high-speed RAM such as static RAM for caching data.

The computer 1002 further includes an internal hard disk drive (HDD) 1014 (e.g., EIDE, SATA), one or more external storage devices 1016 (e.g., a magnetic floppy disk drive (FDD) 1016, a memory stick or flash drive reader, a memory card reader, etc.) and an optical disk drive 1020 (e.g., which can read or write from a CD-ROM disc, a DVD, a BD, etc.). While the internal HDD 1014 is illustrated as located within the computer 1002, the internal HDD 1014 can also be configured for external use in a suitable chassis (not shown). Additionally, while not shown in environment 1000, a solid state drive (SSD) could be used in addition to, or in place of, an HDD 1014. The HDD 1014, external storage device(s) 1016 and optical disk drive 1020 can be connected to the system bus 1008 by an HDD interface 1024, an external storage interface 1026 and an optical drive interface 1028, respectively. The interface 1024 for external drive implementations can include at least one or both of Universal Serial Bus (USB) and Institute of Electrical and Electronics Engineers (IEEE) 1394 interface technologies. Other external drive connection technologies are within contemplation of the embodiments described herein.

The drives and their associated computer-readable storage media provide nonvolatile storage of data, data structures, computer-executable instructions, and so forth. For the computer 1002, the drives and storage media accommodate the storage of any data in a suitable digital format. Although the description of computer-readable storage media above refers to respective types of storage devices, it should be appreciated by those skilled in the art that other types of storage media which are readable by a computer, whether presently existing or developed in the future, could also be used in the example operating environment, and further, that any such storage media can contain computer-executable instructions for performing the methods described herein.

A number of program modules can be stored in the drives and RAM 1012, including an operating system 1030, one or more application programs 1032, other program modules 1034 and program data 1036. All or portions of the operating system, applications, modules, and/or data can also be cached in the RAM 1012. The systems and methods described herein can be implemented utilizing various commercially available operating systems or combinations of operating systems.

Computer 1002 can optionally comprise emulation technologies. For example, a hypervisor (not shown) or other intermediary can emulate a hardware environment for operating system 1030, and the emulated hardware can optionally be different from the hardware illustrated in FIG. 10. In such an embodiment, operating system 1030 can comprise one virtual machine (VM) of multiple VMs hosted at computer 1002. Furthermore, operating system 1030 can provide runtime environments, such as the Java runtime environment or the .NET framework, for applications 1032. Runtime environments are consistent execution environments that allow applications 1032 to run on any operating system that includes the runtime environment. Similarly, operating system 1030 can support containers, and applications 1032 can be in the form of containers, which are lightweight, standalone, executable packages of software that include, e.g., code, runtime, system tools, system libraries and settings for an application.

Further, computer 1002 can be enabled with a security module, such as a trusted processing module (TPM). For instance with a TPM, boot components hash next in time boot components, and wait for a match of results to secured values, before loading a next boot component. This process can take place at any layer in the code execution stack of computer 1002, e.g., applied at the application execution level or at the operating system (OS) kernel level, thereby enabling security at any level of code execution.

A user can enter commands and information into the computer 1002 through one or more wired/wireless input devices, e.g., a keyboard 1038, a touch screen 1040, and a pointing device, such as a mouse 1042. Other input devices (not shown) can include a microphone, an infrared (IR) remote control, a radio frequency (RF) remote control, or other remote control, a joystick, a virtual reality controller and/or virtual reality headset, a game pad, a stylus pen, an image input device, e.g., camera(s), a gesture sensor input device, a vision movement sensor input device, an emotion or facial detection device, a biometric input device, e.g., fingerprint or iris scanner, or the like. These and other input devices are often connected to the processing unit 1004 through an input device interface 1044 that can be coupled to the system bus 1008, but can be connected by other interfaces, such as a parallel port, an IEEE 1394 serial port, a game port, a USB port, an IR interface, a BLUETOOTH® interface, etc.

A monitor 1046 or other type of display device can be also connected to the system bus 1008 via an interface, such as a video adapter 1048. In addition to the monitor 1046, a computer typically includes other peripheral output devices (not shown), such as speakers, printers, etc.

The computer 1002 can operate in a networked environment using logical connections via wired and/or wireless communications to one or more remote computers, such as a remote computer(s) 1050. The remote computer(s) 1050 can be a workstation, a server computer, a router, a personal computer, portable computer, microprocessor-based entertainment appliance, a peer device or other common network node, and typically includes many or all of the elements described relative to the computer 1002, although, for purposes of brevity, only a memory/storage device 1052 is illustrated. The logical connections depicted include wired/wireless connectivity to a local area network (LAN) 1054 and/or larger networks, e.g., a wide area network (WAN) 1056. Such LAN and WAN networking environments are commonplace in offices and companies, and facilitate enterprise-wide computer networks, such as intranets, all of which can connect to a global communications network, e.g., the internet.

When used in a LAN networking environment, the computer 1002 can be connected to the local network 1054 through a wired and/or wireless communication network interface or adapter 1058. The adapter 1058 can facilitate wired or wireless communication to the LAN 1054, which can also include a wireless access point (AP) disposed thereon for communicating with the adapter 1058 in a wireless mode.

When used in a WAN networking environment, the computer 1002 can include a modem 1060 or can be connected to a communications server on the WAN 1056 via other means for establishing communications over the WAN 1056, such as by way of the internet. The modem 1060, which can be internal or external and a wired or wireless device, can be connected to the system bus 1008 via the input device interface 1044. In a networked environment, program modules depicted relative to the computer 1002 or portions thereof, can be stored in the remote memory/storage device 1052. It will be appreciated that the network connections shown are example and other means of establishing a communications link between the computers can be used.

When used in either a LAN or WAN networking environment, the computer 1002 can access cloud storage systems or other network-based storage systems in addition to, or in place of, external storage devices 1016 as described above. Generally, a connection between the computer 1002 and a cloud storage system can be established over a LAN 1054 or WAN 1056 e.g., by the adapter 1058 or modem 1060, respectively. Upon connecting the computer 1002 to an associated cloud storage system, the external storage interface 1026 can, with the aid of the adapter 1058 and/or modem 1060, manage storage provided by the cloud storage system as it would other types of external storage. For instance, the external storage interface 1026 can be configured to provide access to cloud storage sources as if those sources were physically connected to the computer 1002.

The computer 1002 can be operable to communicate with any wireless devices or entities operatively disposed in wireless communication, e.g., a printer, scanner, desktop and/or portable computer, portable data assistant, communications satellite, any piece of equipment or location associated with a wirelessly detectable tag (e.g., a kiosk, news stand, store shelf, etc.), and telephone. This can include Wireless Fidelity (Wi-Fi) and BLUETOOTH® wireless technologies. Thus, the communication can be a predefined structure as with a conventional network or simply an ad hoc communication between at least two devices.

The above description includes non-limiting examples of the various embodiments. It is, of course, not possible to describe every conceivable combination of components or methodologies for purposes of describing the disclosed subject matter, and one skilled in the art can recognize that further combinations and permutations of the various embodiments are possible. The disclosed subject matter is intended to embrace all such alterations, modifications, and variations that fall within the spirit and scope of the appended claims.

With regard to the various functions performed by the above-described components, devices, circuits, systems, etc., the terms (including a reference to a "means") used to describe such components are intended to also include, unless otherwise indicated, any structure(s) which performs the specified function of the described component (e.g., a functional equivalent), even if not structurally equivalent to the disclosed structure. In addition, while a particular feature of the disclosed subject matter may have been disclosed with respect to only one of several implementations, such feature may be combined with one or more other features of the other implementations as may be desired and advantageous for any given or particular application.

The terms "exemplary" and/or "demonstrative" as used herein are intended to mean serving as an example, instance, or illustration. For the avoidance of doubt, the subject matter disclosed herein is not limited by such examples. In addition, any aspect or design described herein as "exemplary" and/or "demonstrative" is not necessarily to be construed as preferred or advantageous over other aspects or designs, nor is it meant to preclude equivalent structures and techniques known to one skilled in the art. Furthermore, to the extent that the terms "includes," "has," "contains," and other similar words are used in either the detailed description or the claims, such terms are intended to be inclusive—in a manner similar to the term "comprising" as an open transition word—without precluding any additional or other elements.

The term "or" as used herein is intended to mean an inclusive "or" rather than an exclusive "or." For example, the phrase "A or B" is intended to include instances of A, B, and both A and B. Additionally, the articles "a" and "an" as used in this application and the appended claims should generally be construed to mean "one or more" unless either otherwise specified or clear from the context to be directed to a singular form.

The term "set" as employed herein excludes the empty set, i.e., the set with no elements therein. Thus, a "set" in the subject disclosure includes one or more elements or entities. Likewise, the term "group" as utilized herein refers to a collection of one or more entities.

The terms "first," "second," "third," and so forth, as used in the claims, unless otherwise clear by context, is for clarity only and doesn't otherwise indicate or imply any order in time. For instance, "a first determination," "a second determination," and "a third determination," does not indicate or imply that the first determination is to be made before the second determination, or vice versa, etc.

The description of illustrated embodiments of the subject disclosure as provided herein, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as one skilled in the art can recognize. In this regard, while the subject matter has been described herein in connection with various embodiments and corresponding drawings, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

What is claimed is:

1. A method, comprising:
monitoring, by network equipment comprising a processor, a volume of non-access stratum short message service messages;
detecting, by the network equipment, during the monitoring, a potential overload condition of a downlink portion of a mobile network, wherein the potential overload condition comprises a first condition in which the volume of non-access stratum short message service messages has a threshold likelihood to exceed a bandwidth associated with the downlink portion of the mobile network;
in response to detecting the potential overload condition:
inhibiting, by the network equipment, non-access stratum short message service messages directed to a network function in order to prevent an overload condition, wherein the overload condition comprises a second condition in which the volume of non-access stratum short message service messages exceeds the bandwidth associated with the downlink portion of the mobile network, wherein the inhibiting of the non-access stratum short message service messages comprises delaying transmission of a first portion of the non-access stratus short message service messages over the downlink portion of the mobile network;
identifying, by the network equipment, duplicate non-access stratum short message service messages from the volume of non-access stratum short message service messages utilizing machine learning resulting in a first identification;
dropping, by the network equipment, the duplicate non-access stratum short message service messages based on the first identification;
identifying, by the network equipment, a receiving mobile device associated with a portion of the volume of non-access stratum short message service messages resulting in a second identification; and
increasing, by the network equipment, bandwidth associated with the receiving mobile device based on the second identification.

2. The method of claim 1, wherein the network equipment comprises a short message services function, and wherein the method is performed by a congestion manager implemented within the short message services function.

3. The method of claim 1, further comprising employing, by the network equipment, model data representative of a machine learning model to learn to detect the potential overload condition.

4. The method of claim 1, further comprising employing, by the network equipment, model data representative of a machine learning model to learn an action used to inhibit the non-access stratum short message service messages directed to the network function in order to prevent the overload condition.

5. The method of claim 1, wherein the network function communicates via a physical downlink shared channel.

6. The method of claim 5, wherein a capability of the physical downlink shared channel comprises a maximum number of bits included in subframes transmitted via the physical downlink shared channel.

7. The method of claim 1, wherein inhibiting the non-access stratum short message service messages directed to the network function comprises dropping a second portion of the non-access stratum short message service messages.

8. The method of claim 1, wherein inhibiting the non-access stratum short message service messages directed to the network function comprises omitting transmission of a duplicate non-access stratum short message service message of the non-access stratum short message service messages.

9. The method of claim 1, wherein inhibiting the non-access stratum short message service messages directed to the network function comprises facilitating blocking a source of the non-access stratum short message service messages.

10. Network equipment, comprising:
a processor; and
a memory that stores executable instructions that, when executed by the processor, facilitate performance of operations, comprising:
collecting non-access stratum short message service message volume data;
learning, based on the collected non-access stratum short message service message volume data, to detect a potential overload condition, wherein the potential overload condition comprises a condition in which a non-access stratum short message service message volume has at least a threshold potential to exceed a bandwidth associated with a downlink portion of a mobile network;
monitoring a volume of non-access stratum short message service messages for the potential overload condition;
in response to detecting the potential overload condition of the downlink portion of the mobile network:
inhibiting non-access stratum short message service messages directed to a network function, wherein the inhibiting of the non-access stratum short message service messages comprises delaying transmission of a first portion of the non-access stratus short message service messages over the downlink portion of the mobile network;
identifying duplicate non-access stratum short message service messages from the volume of non-access stratum short message service messages utilize machine learning resulting in a first identification;
dropping the duplicate non-access stratum short message service messages based on the first identification;
identifying a receiving mobile device associated with a portion of the volume of non-access stratum short message service messages resulting in a second identification; and
increasing bandwidth associated with the receiving mobile device based on the second identification.

11. The network equipment of claim 10, wherein the network equipment comprises a short message services function comprising a congestion manager configured to perform the collecting, learning, monitoring and inhibiting.

12. The network equipment of claim 10, wherein the operations further comprise learning, based on the collected non-access stratum short message service message volume data, an action that inhibits the non-access stratum short message service messages directed to the network function.

13. The network equipment of claim 10, wherein the network function comprises uses a physical downlink shared channel.

14. The network equipment of claim 10, wherein inhibiting the non-access stratum short message service messages directed to the network function comprises dropping a second portion of the non-access stratum short message service messages.

15. The network equipment of claim 10, wherein inhibiting the non-access stratum short message service messages directed to the network function comprises omitting transmission of a duplicate non-access stratum short message service message of the non-access stratum short message service messages.

16. The network equipment of claim 10, wherein inhibiting the non-access stratum short message service messages directed to the network function comprises blocking a source of the non-access stratum short message service messages.

17. A non-transitory machine-readable medium, comprising executable instructions that, when executed by a processor, facilitate performance of operations, comprising:
    monitoring a volume of non-access stratum short message service messages;
    detecting, based on the monitoring, a potential overload condition, wherein the potential overload condition comprises a condition in which the volume of non-access stratum short message service messages has a defined potential to exceed a bandwidth of a physical downlink shared channel;
    in response to detecting the potential overload condition:
        inhibiting non-access stratum short message service messages directed to the physical downlink shared channel, wherein the inhibiting of the non-access stratum short message service messages comprises delaying transmission of a first portion of the non-access stratus short message service messages over the physical downlink shared channel;
        identifying duplicate non-access stratum short message service messages from the volume of non-access stratum short message service messages utilizing machine learning resulting in a first identification;
        dropping the duplicate non-access stratum short message service messages based on the first identification;
        identifying a receiving mobile device associated with a portion of the volume of non-access stratum short message service messages resulting in a second identification; and
        increasing bandwidth associated with the receiving mobile device based on the second identification.

18. The non-transitory machine-readable medium of claim 17, wherein inhibiting the non-access stratum short message service messages directed to the physical downlink shared channel comprises at least one of:
    omitting transmission of a duplicate non-access stratum short message service message of the non-access stratum short message service messages; or
    blocking a source of the non-access stratum short message service messages.

19. The non-transitory machine-readable medium of claim 17, wherein the operations further comprise employing a result of a machine learning process to learn to detect the potential overload condition.

20. The non-transitory machine-readable medium of claim 17, wherein a capability of the physical downlink shared channel comprises a maximum number of bits included in subframes transmitted on the physical downlink shared channel.

* * * * *